(12) United States Patent
Ahn et al.

(10) Patent No.: US 10,251,291 B2
(45) Date of Patent: Apr. 2, 2019

(54) ELECTRONIC DEVICE

(71) Applicant: Samsung Display Co., Ltd., Yongin-si, Gyeonggi-do (KR)

(72) Inventors: Seongsik Ahn, Yongin-si (KR); Minki Kim, Hwaseong-si (KR); Hyungwoo Kwon, Seongnam-si (KR); Gyunsoo Kim, Daejeon (KR); Chang-woo Shim, Cheonan-si (KR); Jinyoung Jung, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/945,248

(22) Filed: Apr. 4, 2018

(65) Prior Publication Data

US 2019/0014671 A1  Jan. 10, 2019

(30) Foreign Application Priority Data

Jul. 7, 2017 (KR) .................... 10-2017-0086702

(51) Int. Cl.
| H01L 51/52 | (2006.01) |
| H05K 5/02 | (2006.01) |
| H05K 1/02 | (2006.01) |
| H05K 5/00 | (2006.01) |
| H05K 1/18 | (2006.01) |
| G06F 3/044 | (2006.01) |

(52) U.S. Cl.
CPC ........... *H05K 5/0217* (2013.01); *H05K 1/028* (2013.01); *H05K 1/181* (2013.01); *H05K 5/0017* (2013.01); *G06F 3/044* (2013.01)

(58) Field of Classification Search
CPC ....... H05K 5/0217; H05K 1/028; H05K 1/181; H05K 5/0017; G06F 3/044
USPC ........................................................ 361/749
See application file for complete search history.

(56) References Cited

FOREIGN PATENT DOCUMENTS

KR   10-2017-0003873 A   1/2017

*Primary Examiner* — Tremesha S Willis
(74) *Attorney, Agent, or Firm* — Innovation Counsel LLP

(57) ABSTRACT

An electronic device may include a window member and a display module disposed on a rear surface of the window member. The display module may include a display panel with a non-bending region and a bending region, a first circuit substrate disposed on a rear surface of the display panel, a second circuit substrate electrically connecting the display panel to the first circuit substrate, a first adhesion member disposed on a rear surface of the first circuit substrate to combine the first circuit substrate with a first member different from the first circuit substrate, and a second adhesion member disposed on a rear surface of the second circuit substrate to combine the second circuit substrate with a second member different from the first circuit substrate.

25 Claims, 16 Drawing Sheets

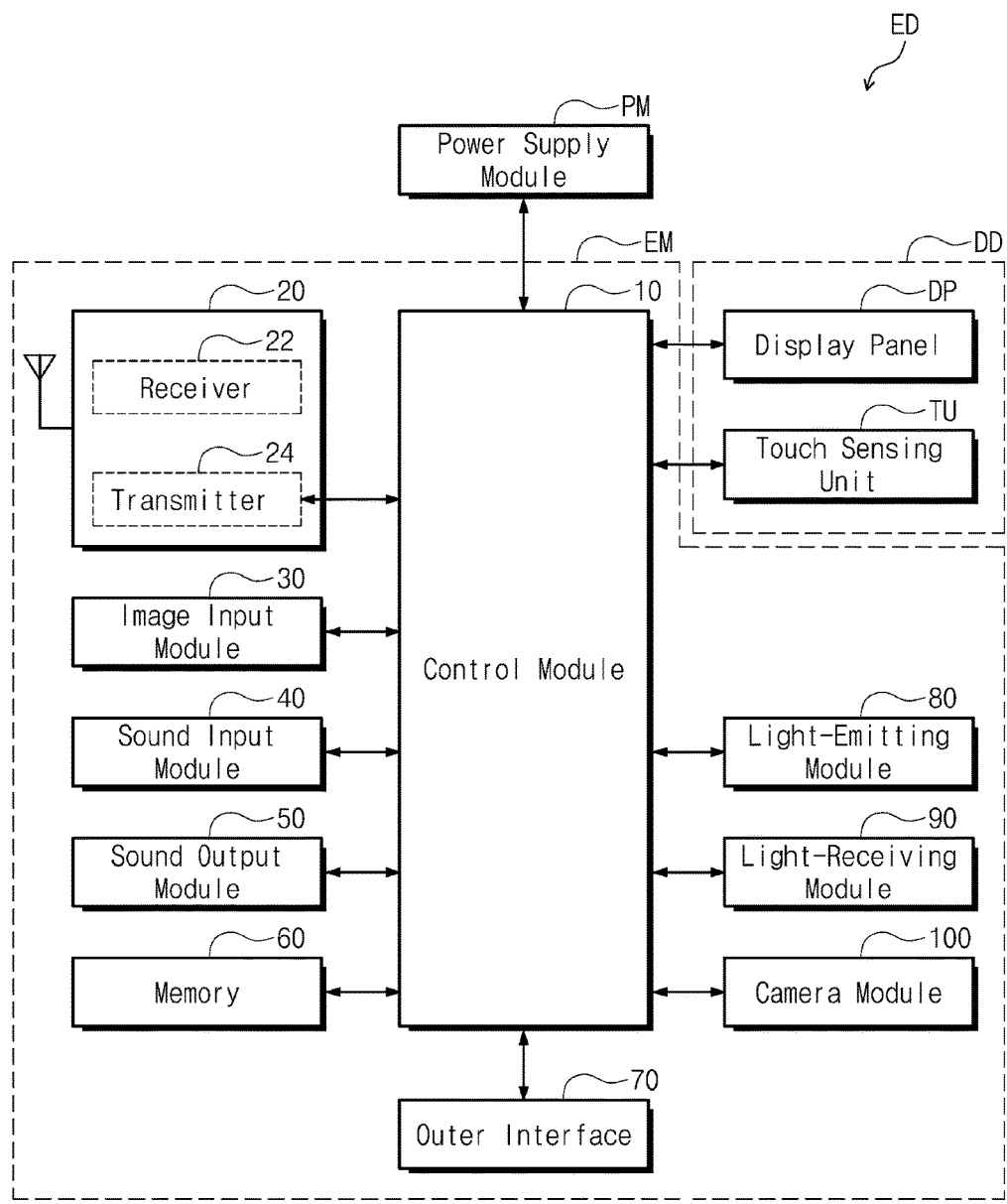

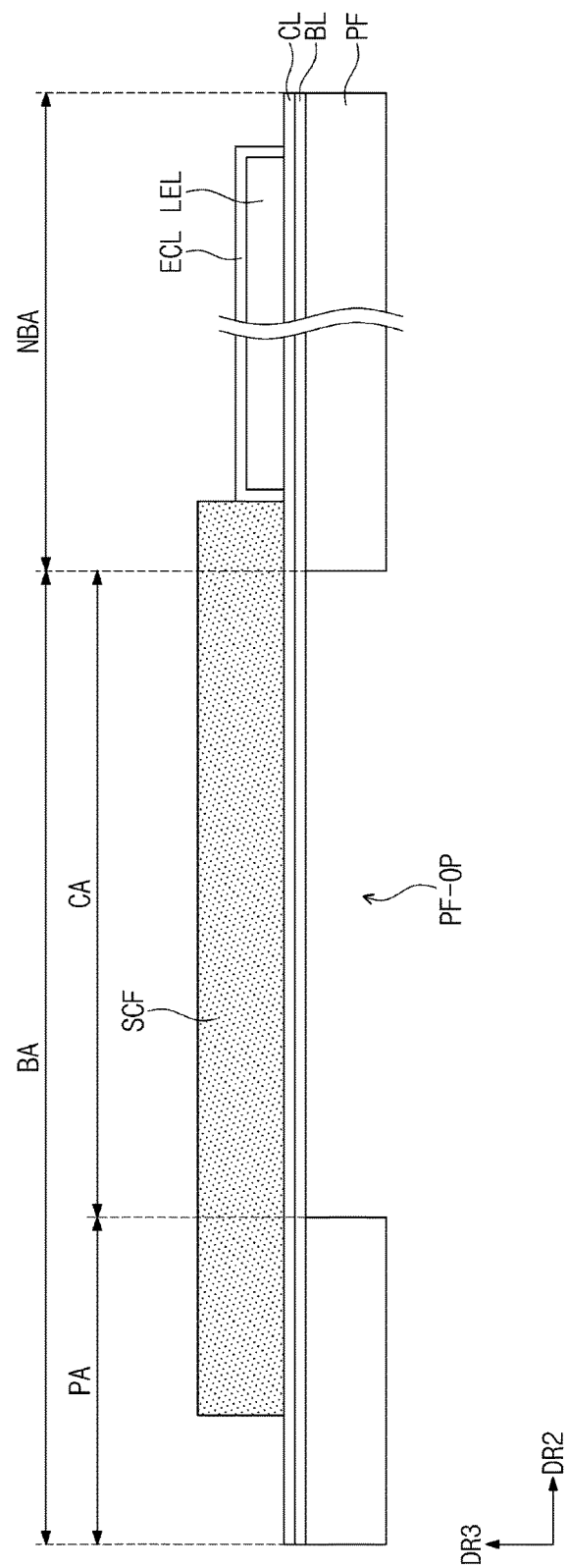

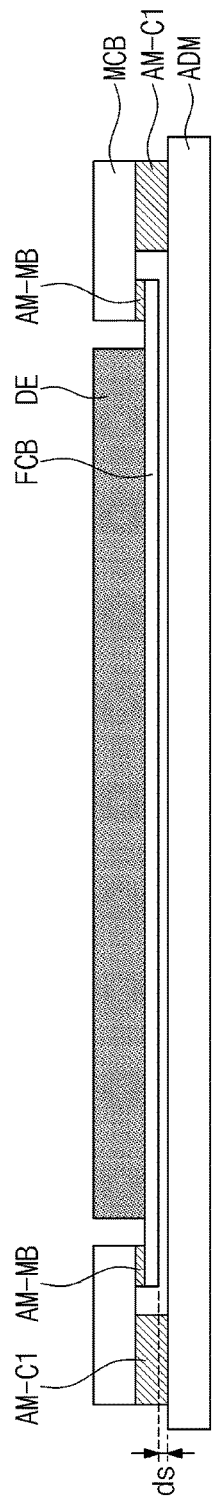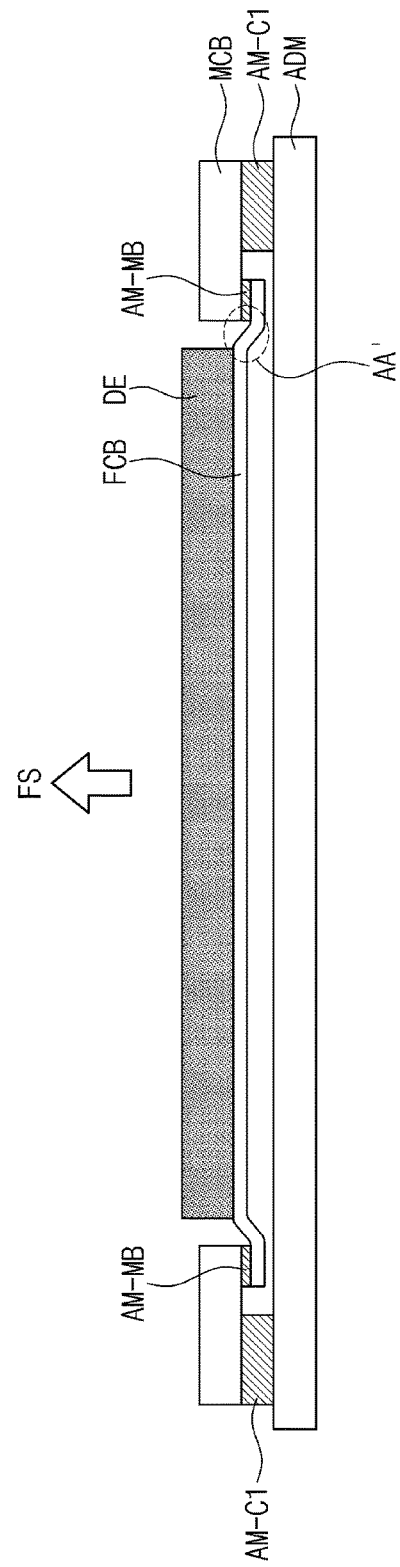

ELECTRONIC DEVICE

CROSS-REFERENCE TO RELATED APPLICATIONS

This U.S. non-provisional patent application claims priority under 35 U.S.C. § 119 to Korean Patent Application No. 10-2017-0086702, filed on Jul. 7, 2017, in the Korean Intellectual Property Office, the entire contents of which are hereby incorporated by reference.

BACKGROUND OF THE INVENTION

The present disclosure relates to an electronic device, and in particular, to an electronic device with improved reliability.

An electronic device is activated by an electrical signal applied thereto. The electronic device may include various electronic components, such as a display device or a touch sensor. The electronic components are assembled or combined with each other by a combining member and then the components are contained in a case. During fabrication or usage of the electronic device, the electronic device may be exposed to a variety of external impacts. The external impact may be exerted on the electronic components in the electronic device.

SUMMARY

Some embodiments of the inventive concept provide an electronic device, which is configured to prevent electronic components contained in the electronic device from being abnormally moved by an external impact and thereby to have improved reliability.

According to some embodiments of the inventive concept, an electronic device may include a window member and a display module disposed on a rear surface of the window member. The display module may include a display panel including a non-bending region and a bending region bent from the non-bending region, the bending region including a curvature region with a specific curvature and an opposite region facing the non-bending region in a thickness direction of the display module, a first circuit substrate disposed on a rear surface of the display panel, a second circuit substrate electrically connecting the display panel with the first circuit substrate, a first adhesion member disposed on a rear surface of the first circuit substrate to combine the first circuit substrate with a first member different from the first circuit substrate, and a second adhesion member disposed on a rear surface of the second circuit substrate to combine the second circuit substrate with a second member different from the first circuit substrate.

In some embodiments, the first member and the second member may be the same.

In some embodiments, the first member may be the display panel, and the first adhesion member and the second adhesion member may be combined at the rear surface of the display panel.

In some embodiments, the display module may further include an additional member disposed between the display panel and the first circuit substrate, and the first member may be the additional member.

In some embodiments, the additional member may include a force sensing unit configured to sense an external pressure.

In some embodiments, the first member may be different from the second member.

In some embodiments, the electronic device may further include an additional member disposed between the display panel and the first circuit substrate. The second member may be the display panel, and the first member may be the additional member.

In some embodiments, the electronic device may further include a driving chip mounted on the second circuit substrate and electrically connected to the display panel.

In some embodiments, the second adhesion member may be overlapped with the driving chip, when viewed in a plan view.

In some embodiments, the second adhesion member may be disposed to enclose the driving chip, when viewed in a plan view.

In some embodiments, the second adhesion member may include a plurality of portions spaced apart from each other.

In some embodiments, the portions may be disposed adjacent to the driving chip.

In some embodiments, the first circuit substrate may further include a cut portion disposed at a region overlapped with the second circuit substrate, and the cut portion may be disposed to enclose at least three sides of the driving chip, when viewed in a plan view.

In some embodiments, the electronic device may further include a conductive member, which is disposed on a front surface of the first circuit substrate and the rear surface of the second circuit substrate to electrically connect the first circuit substrate to the second circuit substrate.

In some embodiments, the conductive member may be overlapped with the second adhesion member, when viewed in a plan view.

In some embodiments, the conductive member may be an anisotropic conductive film.

In some embodiments, the display module may further include a touch sensing unit disposed between the display panel and the window member, the touch sensing unit including a touch sensor configured to sense an external touch event, and a support panel disposed on the rear surface of the display panel.

In some embodiments, the display panel may further include a stress control film disposed on a front surface of the display panel and on the curvature region.

In some embodiments, the second adhesion member combines the second circuit substrate with each of the second member and a third member different from the second member.

According to some embodiments of the inventive concept, an electronic device may include a window member, a display panel disposed on a rear surface of the window member, the display panel including a non-bending region and a bending region bent from the non-bending region, a first circuit substrate disposed on a rear surface of the display panel, a second circuit substrate overlapped with the bending region to electrically connect the first circuit substrate to the display panel, a driving chip being mounted on a front surface of the second circuit substrate and extending in a direction, a conductive member combined to a rear surface of the first circuit substrate and a front surface of the second circuit substrate to electrically connect the first circuit substrate to the second circuit substrate, and a second circuit substrate adhesion member disposed on a rear surface of the second circuit substrate. At least a portion of the second circuit substrate may be overlapped with the driving chip. [See Question about this.]

In some embodiments, the second circuit substrate adhesion member may be overlapped with at least a portion of the driving chip.

In some embodiments, the second circuit substrate adhesion member may be spaced apart from the driving chip, when viewed in a plan view.

In some embodiments, the electronic device may further include a first circuit substrate adhesion member that is disposed on the rear surface of the first circuit substrate to combine the first circuit substrate with a first member different from the first circuit substrate. The second circuit substrate adhesion member combines the second circuit substrate with a second member different from the first circuit substrate.

In some embodiments, the electronic device may further include an additional member disposed between the display panel and the first circuit substrate. The first member may be the additional member.

In some embodiments, the second member may be one of the display panel and the additional member.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 2 is a block diagram of the electronic device of FIG. 1A.

FIG. 3C is a sectional view illustrating a display panel according to some embodiments of the inventive concept.

FIGS. 6A and 6B are sectional views each illustrating a portion of a display device according to a comparative example.

Figure 1A:
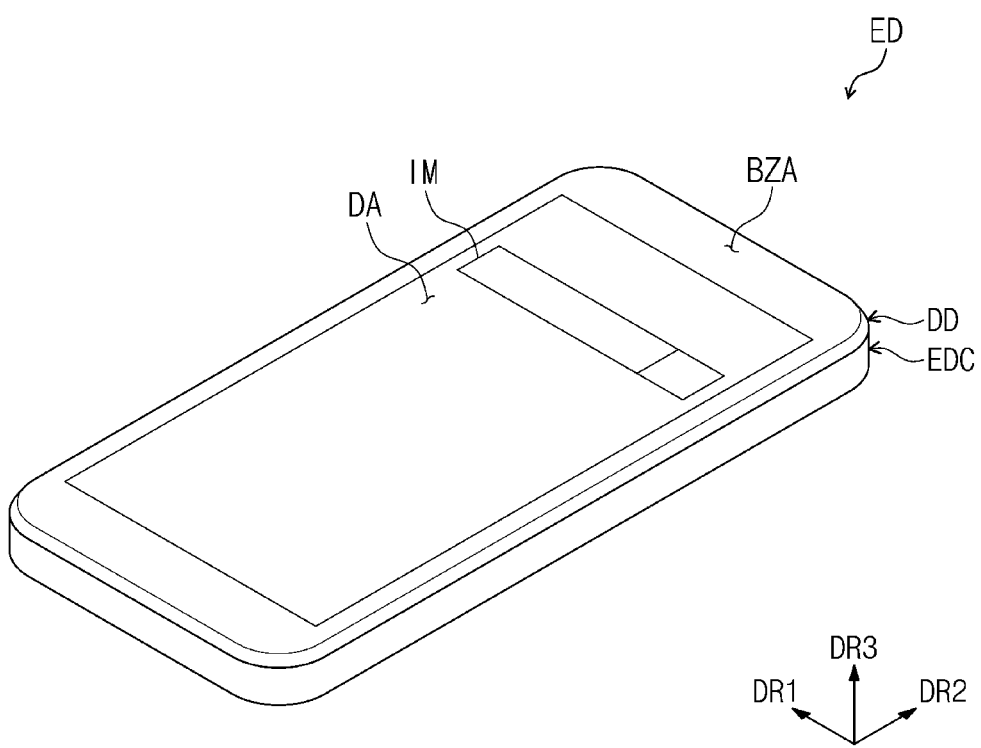
FIG. 1A is an assembled perspective view of an electronic device according to some embodiments of the inventive concept.

It should be noted that these figures are intended to illustrate the general characteristics of methods, member and/or materials utilized in certain example embodiments and to supplement the written description disposed below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are disposed so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
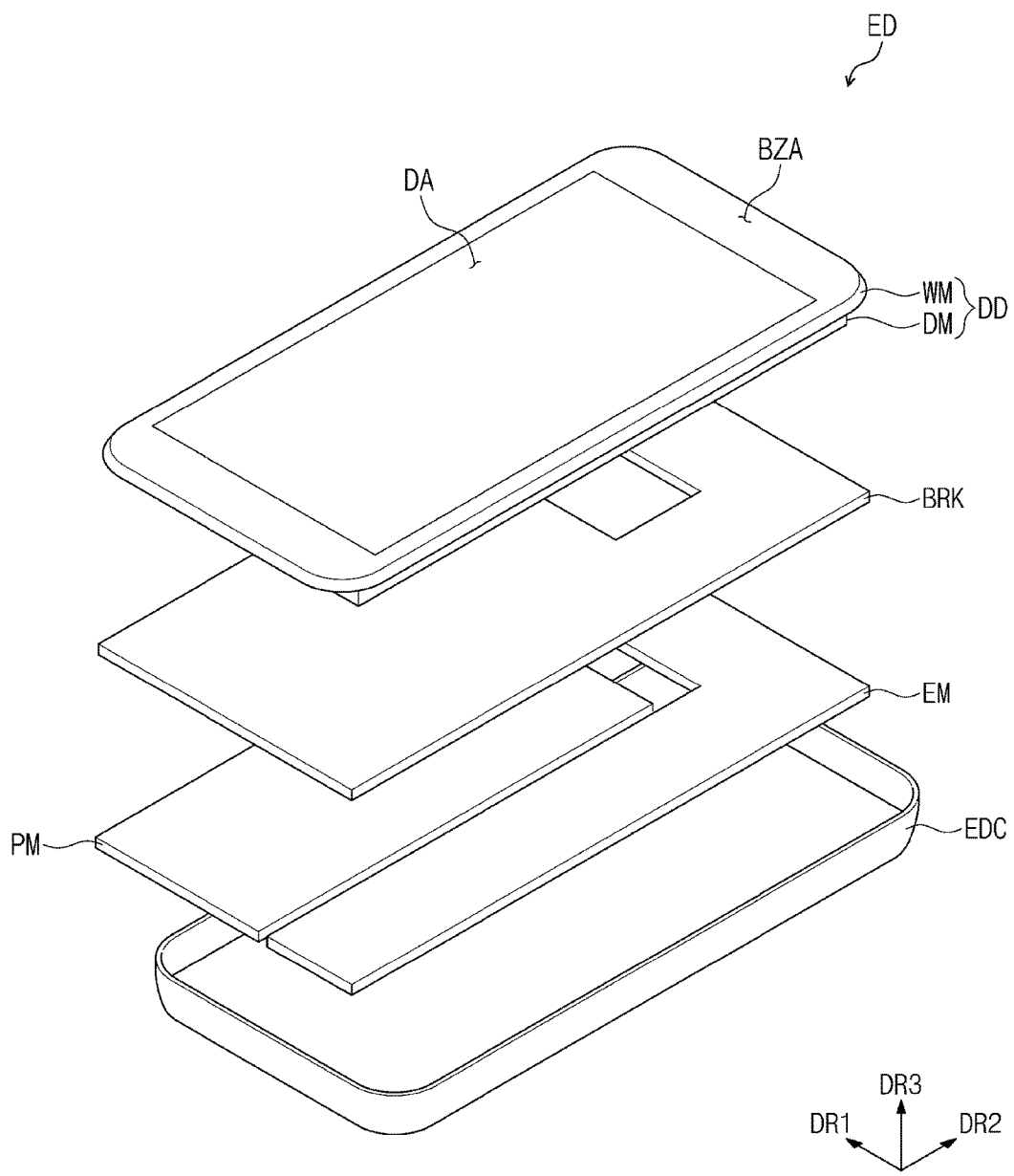
FIG. 1B is an exploded perspective view of the electronic device of FIG. 1A.

FIG. 1A is an assembled perspective view of an electronic device according to some embodiments of the inventive concept, and FIG. 1B is an exploded perspective view of the electronic device of FIG. 1A. FIG. 2 is a block diagram of the electronic device of FIG. 1A.

An electronic device ED may be selectively activated depending on an electrical signal applied thereto. The electronic device ED may be disposed in various forms. For example, the electronic device ED may be one of tablets, notebooks, computers, smart televisions, and so forth. In the present embodiment, the electronic device ED is a smart phone, as illustrated in FIG. 1A.

As shown in FIG. 1A, the electronic device ED may include a display surface, at least a portion of which is used to display an image IM, and which will be described as a plane parallel to a first direction DR1 and a second direction DR2. The display surface may include a display region DA and a bezel region BZA adjacent to or encircling the display region DA.

The display region DA may be used to display the image IM. FIG. 1A illustrates an internet search window as an example of the image IM. The display region DA may have a rectangular shape. However, the inventive concept is not limited to the above examples, and the display region DA may have different shapes in other embodiments.

The bezel region BZA may be disposed adjacent to the display region DA. The bezel region BZA may be disposed to enclose the display region DA. However, the inventive concept is not limited to the above examples, and the bezel region BZA may be disposed on one of sides of the display region DA or may be omitted. Furthermore, the inventive concept is not limited to a specific type of the electronic device ED, and the electronic device ED may be disposed in various forms.

Hereinafter, a direction that is normal to the display surface will be referred to as a thickness direction of the electronic device ED or a third direction DR3. In the present embodiment, a front or top surface and a rear or bottom surface of each element may be distinguished, based on the third direction DR3. The front and rear surfaces may be opposite to each other in the third direction DR3.

In the present specification, directions indicated by the first to third directions DR1, DR2, and DR3 may be relative concepts, and in certain embodiments, they may be changed to indicate other directions. For the sake of simplicity, the description that follows will refer to an example in which the first to third directions DR1, DR2, and DR3 are orthogonal to each other, but the inventive concept is not limited thereto.

As shown in FIGS. 1A and 1B, the electronic device ED may include a display device DD, an electronic module EM, a power supply module PM, a bracket BRK, and an external case EDC. In FIGS. 1A and 1B, the components of the electronic device ED are illustrated in a simplified manner.

The display device DD may include a window member WM and a display module DM. The window member WM may define the front surface of the electronic device ED. The display module DM may be disposed on the rear surface of the window member WM and may be used to display an image. In addition, the display module DM may be configured to sense a user input (e.g., a touch event from a user). The display module DM may be electrically connected to the electronic module EM through a flexible circuit board.

The power supply module PM may be configured to supply electric power to the electronic device ED. The power supply module PM may include a typical battery module.

The bracket BRK may be combined with the display device DD and/or the external case EDC to divide an internal space of the electronic device ED into at least two spaces. The bracket BRK may provide a space for containing other components. In addition, the bracket BRK may be configured to fixedly support the display device DD, to prevent the display device DD from being shaken. The bracket BRK may have a connection hole, which is formed to have a shape corresponding to that of the electronic module EM and thereby to allow the electronic module EM to be fastened thereto. The bracket BRK may include a metallic or plastic part. Although the electronic device ED is illustrated to have just one bracket BRK, the electronic device ED may be configured to include a plurality of brackets BRK.

The external case EDC may be combined with the bracket BRK and/or the display device DD. The external case EDC may define an outer appearance of the electronic device ED. Although the external case EDC is illustrated as a single body, the external case EDC may include a plurality of bodies that are assembled with each other. The external case EDC may include a plurality of frames and/or plates, each of which is formed of at least one of glass, plastic, or metallic materials.

The electronic module EM may include a motherboard and various functional modules, which are mounted on the motherboard and are used to operate the electronic device ED. The motherboard may be electrically connected to the display device DD through a connector (not shown). In the present embodiment, the motherboard includes a rigid-type printed circuit board.

As shown in FIG. 2, the electronic module EM may include a control module 10, a wireless communication module 20, an image input module 30, a sound input module 40, a sound output module 50, a memory 60, an outer interface 70, a light-emitting module 80, a light-receiving module 90, and a camera module 100. At least one of the modules may not be mounted on the motherboard and may be electrically connected to the motherboard through a flexible circuit board.

The control module 10 may be configured to control overall operations of the electronic device ED. The control module 10 may be, for example, a microprocessor. In some embodiments, the display device DD may be activated or inactivated under the control of the control module 10. The control module 10 may control the image input module 30, the sound input module 40, and the sound output module 50, based on touch signals received from the display device DD.

The wireless communication module 20 may be configured to transmit and receive a wireless signal to and from another terminal via a Bluetooth or a Wi-Fi line. The wireless communication module 20 may be configured to transmit and receive a voice signal via a typical communication line. The wireless communication module 20 may include a transmitter 24, which is configured to modulate and transmit a signal to be transmitted, and a receiver 22, which is configured to demodulate the received signal.

The image input module 30 may be configured to process an image signal and to convert it into image data that can be displayed on the display device DD. The sound input module 40 may be configured to receive an external sound signal, which is obtained by a microphone in a recording mode, a voice recognition mode, and so forth, and then to convert it into electrical voice data. The sound output module 50 may be configured to convert sound data, which is transmitted from the wireless communication module 20 or is stored in the memory 60, and to output the converted sound data to the outside.

The outer interface 70 may be configured to serve as an interface that is connected to an external charger, a wired/wireless data port, a card socket (e.g., a memory card or a SIM/UIM card), and so forth.

The light-emitting module 80 may be configured to generate and output light. In certain embodiments, the light-emitting module 80 may be configured to emit infrared light. The light-emitting module 80 may include a light-emitting diode (LED) device. The light-receiving module 90 may be configured to sense the infrared light. The light-receiving module 90 may be configured to be activated, when the infrared light incident thereto has an intensity higher than a reference value. The light-receiving module 90 may be a complementary metal-oxide semiconductor (CMOS) image sensor. The infrared light emitted from the light-emitting module 80 may be reflected by an external object (e.g., a user's finger or face) and may be received by the light-receiving module 90. The camera module 100 may be used to obtain an image of an external object.

Figure 3A:
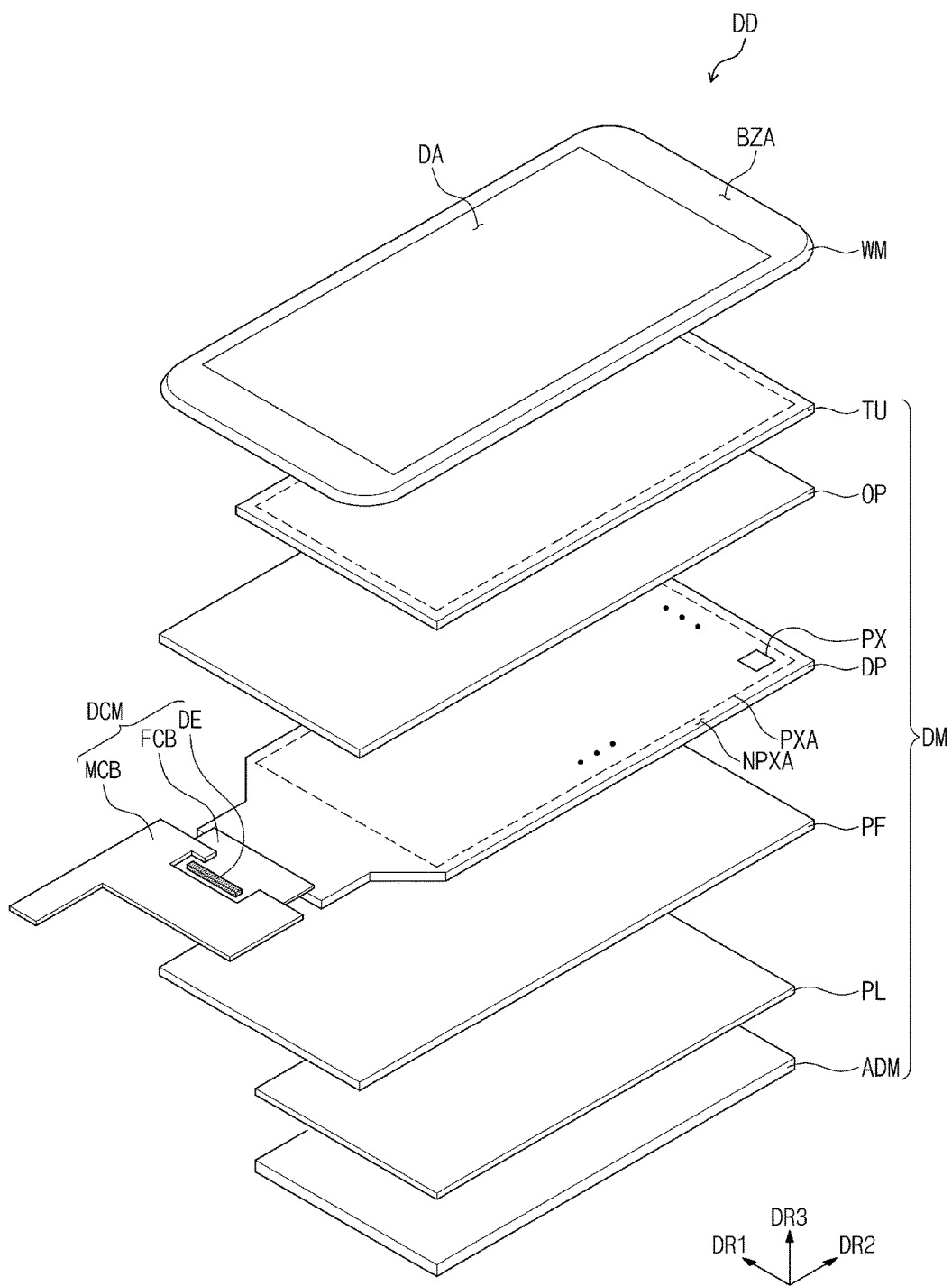
FIG. 3A is an exploded perspective view of a display device according to some embodiments of the inventive concept.
Figure 3B:
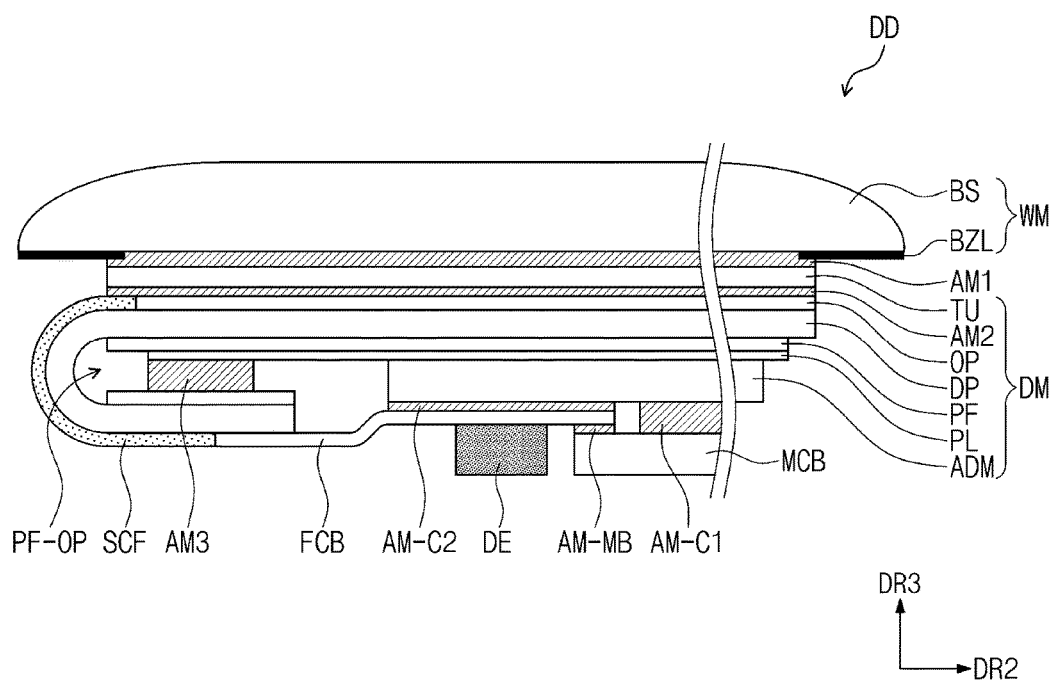
FIG. 3B is a sectional view illustrating a display device according to some embodiments of the inventive concept.

FIG. 3A is an exploded perspective view of a display device according to some embodiments of the inventive concept. FIG. 3B is a sectional view illustrating a display device according to some embodiments of the inventive concept. FIG. 3C is a sectional view illustrating a display panel according to some embodiments of the inventive concept. FIG. 3A schematically illustrates the display device, and FIGS. 3B and 3C illustrate vertical sections of the display device, taken in the second direction DR2.

FIGS. 3A and 3B illustrate several components constituting the display device DD, which is used as a part of the electronic device ED shown in FIGS. 1A and 1B. The display device DD may include the window member WM and the display module DM.

The window member WM may include a base member BS and a bezel layer BZL. A region, on which the bezel layer BZL is placed, may be defined as the bezel region BZA. Although, in the present embodiment, the window member WM is illustrated to have a flat shape on the display region DA, the shape of the window member WM may be changed. For example, the window member WM may include at least one curved surface disposed on the display region DA.

The base member BS may include a glass substrate, a sapphire substrate, a plastic film, and so forth. The base member BS may have a single- or multi-layered member. For example, the base member BS may include a plurality of plastic films, which are combined with each other by an adhesive element. In one embodiment, m the base member BS includes a glass substrate and a plastic film, which is combined with the glass substrate by an adhesive material.

The bezel layer BZL may be disposed on the rear surface of the base member BS. The bezel layer BZL may have a single- or multi-layered member. In the case of the multi-layered member, the bezel layer BZL may include a buffer layer having a good adhesive property, a patterned layer displaying a specific pattern, and an achromatic layer.

The bezel layer BZL may be formed by a deposition, printing, or coating method.

Although not shown, the window member WM may further include a functional coating layer disposed on the front surface of the base member BS. The functional coating layer may include an anti-fingerprint layer, an anti-reflection layer, a hard coating layer, and so forth. However, the inventive concept is not limited to the above example, and in certain embodiments, the bezel layer BZL may be omitted from the window member WM.

The display module DM may include a display panel DP, a touch sensing unit TU, an anti-reflection panel OP, a support panel PF, a stress control film SCF, and a driving control module DCM. In FIG. 3A, the display panel DP is illustrated in an unfolded state.

The display panel DP may be configured to display an image on the display region DA in response to electrical signals applied thereto. The display panel DP may be disposed in various forms. For example, the display panel DP may include an organic light emitting display panel, an electrophoresis display panel, an electrowetting display panel, or a liquid crystal display panel. For the sake of simplicity, the description that follows will refer to an example in which the display panel DP is an organic light emitting display panel.

The display panel DP may include a plurality of pixels PX. The pixels PX may be configured to generate light in response to electrical signals applied thereto, and lights generated by the pixels PX may form an image to be displayed through the display panel DP. Each of the pixels PX may include a display element. The display element may be a liquid crystal capacitor, an electrophoresis device, an electrowetting device, an organic light emitting device, and so forth. In the present embodiment, each of the pixels PX may include an organic light emitting device.

The display panel DP may be divided into a pixel region PXA, in which the pixels PX are disposed, and a non-pixel region NPXA adjacent to the pixel region PXA, when viewed in a plan view. The pixel region PXA may be disposed at a position corresponding to the display region DA. Peripheral components, such as signal lines and banks connected to the pixels PX, may be disposed in the non-pixel region NPXA. The non-pixel region NPXA may be disposed at a position corresponding to the bezel region BZA. However, the corresponding regions need not be completely identical to each other (e.g., in shape, area, and so forth).

A width, in the first direction DR1, of the display panel DP may vary depending on a region. For example, when measured in the first direction DR1, a width of the pixel region PXA of the display panel DP may be different from that of the non-pixel region NPXA. A portion of the non-pixel region NPXA connected to the driving control module DCM may have a width smaller than that of the pixel region PXA, when measured in the first direction DR1.

The display panel DP may be flexible. Accordingly, as shown in FIG. 3B, a portion of the display panel DP may be bent, when it is assembled. This feature of the display panel DP will be described in more detail with reference to FIG. 3C.

The display panel DP may include a non-bending region NBA and a bending region BA, which is curvedly extended from the non-bending region NBA. The bending region BA may correspond to the portion having a relatively small width. In some embodiments, since the bending region BA has a relatively small width, the display panel DP may be easily bent.

The display panel DP may include a base layer BL, a circuit layer CL, a device layer LEL, and an encapsulation layer ECL. The base layer BL may be disposed at a region corresponding to the non-bending region NBA and the bending region BA.

The base layer BL may be formed of or include an insulating material. In addition, the base layer BL may have a flexible property. For example, the base layer BL may include an organic resin. As an example, the base layer BL may include polyimide and so forth, but the inventive concept is not limited thereto.

The circuit layer CL may be disposed on the front surface of the base layer BL. The circuit layer CL may be disposed at a region corresponding to the non-bending region NBA and the bending region BA. The circuit layer CL may have a multi-layered member including at least one insulating layer and at least one conductive layer. The circuit layer CL may include a pixel circuit with thin-film transistors and signal lines connected to the pixel circuit.

The device layer LEL may be disposed on the front surface of the circuit layer CL. The device layer LEL may include a display element (e.g., an organic light emitting device). In the present embodiment, the device layer LEL may be disposed at a region corresponding to the display region DA. The encapsulation layer ECL may be disposed on the device layer LEL to seal the device layer LEL. The encapsulation layer ECL may have a double-layered member including an organic layer and an inorganic layer and include an encapsulation substrate and a sealant.

The bending region BA of the display panel DP may include a curvature region CA and an opposite region PA. The curvature region CA may be connected to the non-bending region NBA and may be configured to have a bendable or foldable property. The opposite region PA may be connected to the curvature region CA and may not be used to form a curved surface.

In the case where the display panel DP is bent or folded, the opposite region PA may be placed at a position facing the non-bending region NBA. In the case where the display panel DP is unfolded, the opposite region PA may be spaced apart from the non-bending region NBA with the curvature region CA interposed therebetween, in the second direction DR2. In the case where the display panel DP is bent or folded, the opposite region PA may be overlapped with the non-bending region NBA, when viewed in a plan view.

In the opposite region PA, pads of the circuit layer CL may be disposed in an aligned manner. A flexible circuit substrate FCB may be coupled to the display panel DP through the pads of the opposite region PA.

The support panel PF may be disposed on the rear surface of the base layer BL. The support panel PF may include an opening PF-OP that is defined on the curvature region CA. The opening PF-OP may be a slit extending in the first direction DR1, a plurality of openings, or a plurality of grooves. In other words, the support panel PF on the curvature region CA may have a thickness smaller than other portions positioned on other regions or may be at least partially removed.

Owing to the opening PF-OP defined on the curvature region CA, the support panel PF may not be overlapped with the curvature region CA. The support panel PF may be weakly affected by a stress caused by bending of the display panel DP. Accordingly, it is desirable to relieve a bending stress exerted on the circuit layer CL.

The stress control film SCF may be disposed on the front surface of the circuit layer CL. The stress control film SCF may be disposed on the bending region BA. The stress control film SCF may be disposed at a region corresponding to at least the curvature region CA.

The stress control film SCF may be configured to allow a neutral plane of the curvature region CA to be positioned adjacent to the circuit layer CL. The neutral plane may be a surface, in which there is no difference between compressive and tensile stress exerted thereon and a resultant stress vanishes. The stress control film SCF may include portions that are overlapped with the non-bending region NBA and the opposite region PA. The stress control film SCF may include an insulating material and/or a flexible material.

The anti-reflection panel OP may include a polarization film and/or a phase-retardation film. The polarization film and the phase-retardation film may be typical elongated-type films. Here, an adhesion member (not shown) may be further disposed between the anti-reflection panel OP and the display panel DP. In certain embodiments, the anti-reflection panel OP may be omitted. In certain embodiments, the display panel DP may further include a color filter layer or an anti-reflection layer disposed on the encapsulation layer ECL. However, the inventive concept is not limited to the above examples, and the display device DD may have different configurations in other embodiments.

The touch sensing unit TU may be disposed on the anti-reflection panel OP. The touch sensing unit TU may be formed to sense a touch event to be input from the outside. The touch event from the outside may be input through the window member WM.

The touch sensing unit TU may be configured to sense various touch events or inputs that are disposed in various manners. For example, the touch event may include physical contact, hovering, optical, and pressure.

The touch sensing unit TU may be, for example, a capacitive-type touch sensing unit, an inductive-type touch sensing unit, and so forth. The touch sensing unit TU may include a base layer and touch sensors. When viewed in a plan view, the touch sensing unit TU may include a sensing region, in which the touch sensors are arranged, and a peripheral region, in which the touch sensors are not arranged. In FIG. 3A, the sensing region is depicted by a dotted line. The sensing region may be located at a region corresponding to the pixel region PXA, as shown in FIG. 3A. However, the inventive concept is not limited to the above examples, and a position and a shape of the sensing region of the touch sensing unit TU may be configured differently in other embodiments.

The driving control module DCM may include a main circuit substrate MCB (hereinafter, a first circuit substrate) and a flexible circuit substrate FCB (hereinafter, a second circuit substrate), which is disposed to connect the main circuit substrate MCB to the display panel DP.

Although not shown, the first circuit substrate MCB may further include a plurality of electronic components mounted on the first circuit substrate MCB. The electronic components may be electrically connected to each other by circuit interconnection lines. The first circuit substrate MCB may be electrically connected to the second circuit substrate FCB and the display panel DP.

In addition, the first circuit substrate MCB may further include a protection cover that is disposed to cover the electronic components. The protection cover may be a metallic protection cover or may be combined with the first circuit substrate MCB by a soldering method. The first circuit substrate MCB may be electrically connected to the motherboard of the electronic module EM (e.g., see FIG. 1B) through a connector (not shown).

The second circuit substrate FCB may include a flexible film and a plurality of circuit interconnection lines disposed in the flexible film. The circuit interconnection lines may be used to electrically connect the first circuit substrate MCB to the display panel DP.

The driving control module DCM may further include a driving device DE disposed on the second circuit substrate FCB. The driving device DE may be electrically connected to the display panel DP through at least one of the circuit interconnection lines of the second circuit substrate FCB. The driving device DE may be configured to transmit or receive a variety of driving signals to or from the display panel DP.

In the present embodiment, the driving device DE may be disposed in the form of a chip. The driving device DE may be mounted on the second circuit substrate FCB in a chip-on-film (COF) manner. However, the inventive concept is not limited to the above examples, and the shape of the driving device DE may beconfigured differently in other embodiments.

A protection panel PL may be disposed on the rear surface of the display panel DP to support the display panel DP. The protection panel PL may be disposed on the non-bending region NBA of the display panel DP. In the present embodiment, the protection panel PL may be combined to a region of the rear surface of the support panel PF overlapped with the non-bending region NBA.

The protection panel PL may be a metal plate whose stiffness is higher than a reference stiffness. The protection panel PL may be a stainless steel plate. The protection panel PL may be configured to have an opaque property (that is, to prevent an external light from being incident into the display panel DP).

In the present embodiment, the touch sensing unit TU and an anti-reflection panel OP are illustrated to be combined with each other by the adhesive members, but in certain embodiments, at least one of the touch sensing unit TU and the anti-reflection panel OP may be omitted. At least one of the touch sensing unit TU and the anti-reflection panel OP may be integrated on the display panel DP by a successive process. The touch sensors disposed on the encapsulation layer ECL (e.g., see FIG. 3C) may be configured to have the same function as that of the touch sensing unit TU, and the color filters disposed on the encapsulation layer ECL may be configured to have the same function as that of an anti-reflection unit ARU.

The driving control module DCM may also be omitted. In the case where the driving devices DE are mounted on the display panel DP, the driving control module DCM may be embedded in the display panel DP. However, the flexible circuit substrate may be connected to the display panel DP.

In the present embodiment, the display device DD may further include an additional member ADM. The additional member ADM may be disposed on the rear surface of the display panel DP. In the present embodiment, the additional member ADM may be disposed on the rear surface of the protection panel PL. In certain embodiments, the additional member ADM may be attached to the rear surface of the protection panel PL by an adhesion member (not shown).

The additional member ADM may include various components. For example, the additional member ADM may include a force sensing unit for sensing pressure to be exerted from the outside. Here, the additional member ADM may include sensors configured to sense a change in pressure.

In certain embodiments, the additional member ADM may include a spacer that is used to maintain a bent shape of the display panel DP. In certain embodiments, the additional member ADM may include a power supply unit connected to the first circuit substrate MCB. The inventive concept is not limited to a specific component for the additional member ADM, various components may be used as the additional member ADM.

Hereinafter, the display module DM will be described in more detail with reference to FIG. 3B. Adhesion members AM1, AM2, AM3, AM-MB, AM-C1, and AM-C2 to be described below may include a photo-curable adhesive material or a heat-curable adhesive material, but the inventive concept is not limited to a specific material for the adhesion members. The adhesion members AM1, AM2, AM3, AM-MB, AM-C1, and AM-C2 may include an optically clear adhesive (OCA) film, an optically clear resin (OCR) film, or a pressure sensitive adhesive (PSA) film. In certain embodiments, at least one of the adhesion members AM1, AM2, AM3, AM-MB, AM-C1, and AM-C2 may be omitted.

A window adhesion member AM1 may be disposed between the window member WM and the display module DM. The window adhesion member AM1 may be disposed to combine the window member WM with the display module DM.

A touch adhesion member AM2 may be disposed between the touch sensing unit TU and the anti-reflection panel OP. The touch adhesion member AM2 may be disposed to combine the touch sensing unit TU with the anti-reflection panel OP.

A bending adhesion member AM3 may be disposed on the rear surface of the protection panel PL. The bending adhesion member AM3 may be disposed to combine a portion of the support panel PF, which is overlapped with the opposite region PA, with the protection panel PL. The bending adhesion member AM3 may be used to stably maintain a bent shape of the display panel DP.

A conductive adhesion member AM-MB (hereinafter, a conductive member) may be disposed between the first circuit substrate MCB and the second circuit substrate FCB. The conductive member AM-MB may be combined to the rear surface of the first circuit substrate MCB and the front surface of the second circuit substrate FCB.

In the present embodiment, the conductive member AM-MB may be configured to have a conductive property. For example, the conductive member AM-MB may include an anisotropic conductive film (ACF). Accordingly, the conductive member AM-MB may be used to physically and electrically connect the first circuit substrate MCB to the second circuit substrate FCB. However, the inventive concept is not limited to the above examples, and the conductive member AM-MB may be disposed to have both of an adhesion member having an insulating property and a conductive member having a conductive property.

A first circuit substrate adhesion member AM-C1 (hereinafter, a first adhesion member) may be disposed on the rear surface of the first circuit substrate MCB. In the case where the display panel DP is bent, the rear surface of the first circuit substrate MCB may be placed to face the same direction as the front surface of the window member WM.

The first adhesion member AM-C1 may be disposed between the first circuit substrate MCB and the additional member ADM to combine the first circuit substrate MCB with the additional member ADM. Accordingly, the first circuit substrate MCB may be stably fixed to the rear surface of the additional member ADM.

A second circuit substrate adhesion member AM-C2 (hereinafter, a second adhesion member) may be disposed on the rear surface of the second circuit substrate FCB. In the case where the display panel DP is bent, the rear surface of the second circuit substrate FCB may be placed to face the same direction as the front surface of the window member WM.

The second adhesion member AM-C2 may be disposed between the second circuit substrate FCB and the additional member ADM to combine the second circuit substrate FCB with the additional member ADM. Accordingly, the second circuit substrate FCB may be stably fixed to the rear surface of the additional member ADM.

According to some embodiments of the inventive concept, since the electronic device includes the first adhesion member AM-C1 and the second adhesion member AM-C2, it may be possible to stably fix the driving control module DCM to the display panel DP, when the display panel DP is bent or folded. In addition, since the first adhesion member AM-C1 and the second adhesion member AM-C2 are included, it may be possible to stably fix a predetermined component to the first circuit substrate MCB and the second circuit substrate FCB, respectively. Accordingly, the driving control module DCM may be prevented from being abnormally moved by an external impact, and thus, it may be possible to improve the reliability of the product device.

The first adhesion member AM-C1 and the second adhesion member AM-C2 may be provided at the substantially same time in the process. For example, the first adhesion member AM-C1 and the second adhesion member AM-C2 may be disposed on the rear surface of the first circuit substrate MCB and the rear surface of the second circuit substrate FCB, respectively, before the bending of the display panel DP, and then may be attached to the additional member ADM when the display panel DP is bent. Accordingly, it may be possible to simultaneously provide the first adhesion member AM-C1 and the second adhesion member AM-C2 without an additional process, and thereby to simplify the fabrication process and reduce the fabrication cost.

Figure 4:
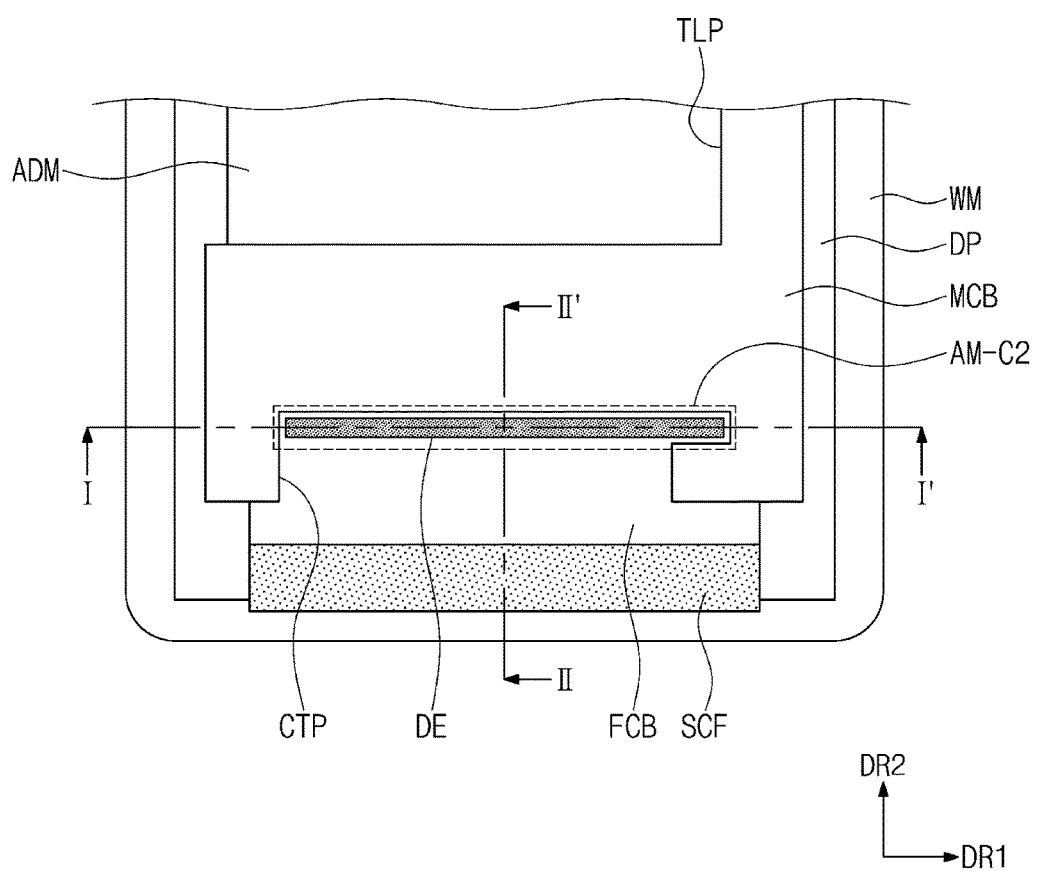
FIG. 4 is a plan view illustrating a portion of a display device according to some embodiments of the inventive concept.
Figure 5A:
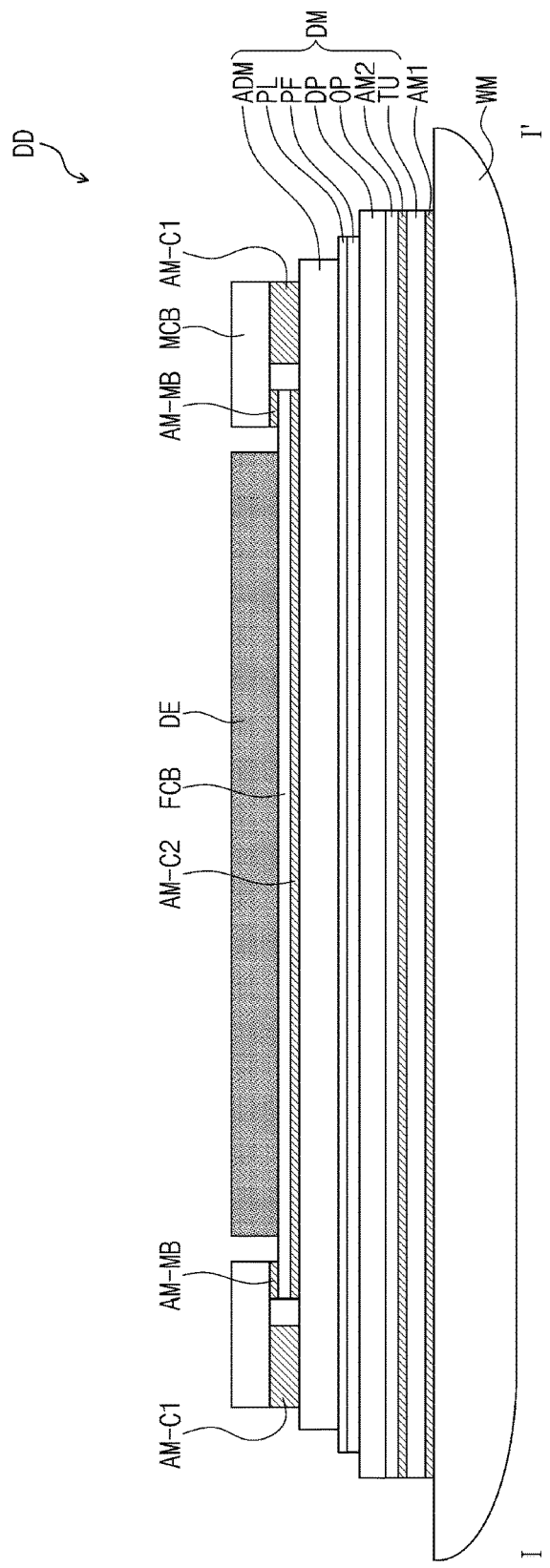
FIG. 5A is a sectional view taken along line of FIG. 4.
Figure 5B:
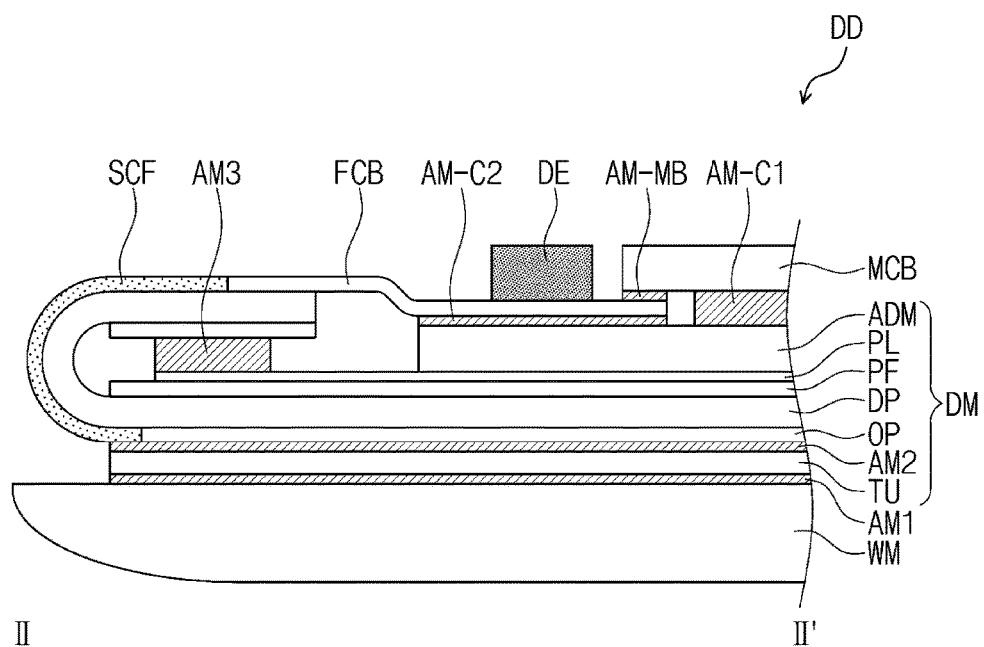
FIG. 5B is a sectional view taken along line II-II' of FIG. 4.

FIG. 4 is a plan view illustrating a portion of a display device according to some embodiments of the inventive concept. FIG. 5A is a sectional view taken along line I-I' of FIG. 4, and FIG. 5B is a sectional view taken along line II-II' of FIG. 4. In FIG. 4, a diagram corresponding to a rear view of the display device shown in FIG. 3C is illustrated in a simplified manner. Hereinafter, a display device according to some embodiments of the inventive concept will be described with reference to FIGS. 4, 5A, and 5B.

As shown in FIG. 4, when the display panel DP is bent or folded, the additional member ADM, the first circuit substrate FCB, and second circuit substrate MCB may be disposed on the rear surface of the display panel DP. Here, as described above, a portion of the stress control film SCF may be bent to extend to the rear surface of the display panel DP.

In the present embodiment, when viewed in an extension direction of the driving device DE or in the first direction DR1, at least a portion of the first circuit substrate MCB may be overlapped with the driving device DE. For example, the first circuit substrate MCB may further include a cut portion CTP.

The cut portion CTP may be defined in a region overlapped with the second circuit substrate FCB. The cut portion CTP may be formed by cutting off a portion of the first circuit substrate MCB overlapping the second circuit substrate FCB in a plan view from an initial circuit substrate overlap the second circuit substrate FCB. The cut portion CTP may be defined to be adjacent at least three sides of the driving device DE. In the present embodiment, the cut portion CTP may have a rectangular shape with partially opened side. Accordingly, three sides and a portion of a remaining side of the driving device DE may be enclosed by the cut portion CTP.

According to some embodiments of the inventive concept, since the first circuit substrate MCB further includes the cut portion CTP, an area of an overlapping region between the first circuit substrate MCB and the second circuit substrate FCB may be decreased. Accordingly, occupying areas of the first circuit substrate MCB and the second circuit substrate FCB may be substantially reduced as compared a case that the first circuit substrate MCB overlap the whole of the second circuit substrate FCB without the cut portion CTP, and this may make it possible to relieve a limited area issue in designing a circuit substrate.

The first circuit substrate MCB may further include a tail portion TLP. The tail portion TLP may have a relatively small width in the first direction DR1. However, the inventive concept is not limited to the above examples, and the cut portion CTP or the tail portion TLP may be disposed in various forms or may be omitted. The inventive concept is not limited to a specific shape of the first circuit substrate MCB, and the first circuit substrate MCB may have different shapes in other embodiments.

Referring to FIGS. 4, 5A, and 5B, the first adhesion member AM-C1 may be disposed between the first circuit substrate MCB and the additional member ADM to combine the first circuit substrate MCB with the additional member ADM. The first adhesion member AM-C1 may be disposed on an overlapping region between the first circuit substrate MCB and the additional member ADM. The first adhesion member AM-C1 may be spaced apart from the conductive member AM-MB. In the present embodiment, the first adhesion member AM-C1 may be disposed on a region of the first circuit substrate MCB, which is not overlapped with the second circuit substrate FCB and is overlapped with the additional member ADM.

The second adhesion member AM-C2 may be disposed between the second circuit substrate FCB and the additional member ADM to combine the second circuit substrate FCB with the additional member ADM. The second adhesion member AM-C2 may be disposed on a region of the second circuit substrate FCB overlapped with the additional member ADM.

In the present embodiment, the second adhesion member AM-C2 may be disposed on a region overlapped with the driving device DE. The second adhesion member AM-C2 may have a rectangular shape, as depicted by the dotted line of FIG. 4. Accordingly, the second adhesion member AM-C2 may stably fix a region of the second circuit substrate FCB, on which the driving device DE is placed.

The second adhesion member AM-C2 may be overlapped with the conductive member AM-MB, when viewed in a plan view. For example, the conductive member AM-MB may be combined to a portion of the front surface of the second circuit substrate FCB, and the second adhesion member AM-C2 may be combined to the rear surface of the second circuit substrate FCB.

In the present embodiment, the driving control module DCM (e.g., see FIG. 3A) including the first circuit substrate MCB and the second circuit substrate FCB may be fixed to the additional member ADM by a plurality of adhesion members including the first adhesion member AM-C1 and the second adhesion member AM-C2. Accordingly, it may be possible to effectively prevent each of the first circuit substrate MCB and the second circuit substrate FCB from being abnormally moved by an external impact.

Figure 7:
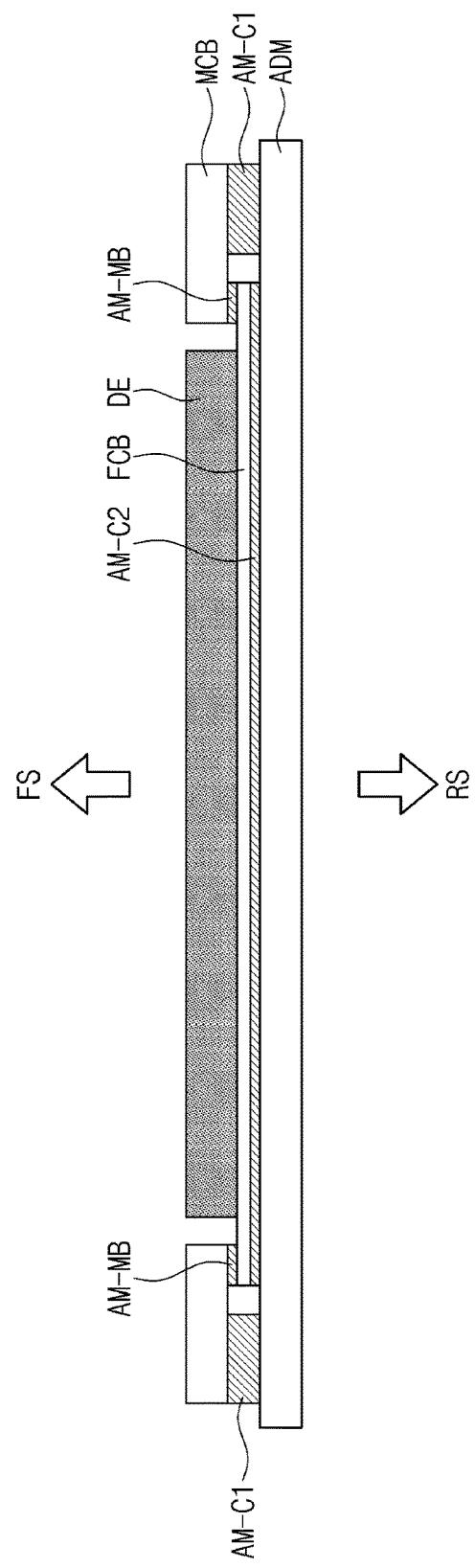
FIG. 7 is a sectional view illustrating a portion of a display device according to some embodiments of the inventive concept.

FIGS. 6A and 6B are sectional views each illustrating a portion of a display device according to a comparative example (hereinafter, a comparative display device). FIG. 7 is a sectional view illustrating a portion of a display device according to some embodiments of the inventive concept (hereinafter, an example display device). In order to reduce complexity in the drawings and to provide better understanding of the inventive concept, some elements of the comparative and example display devices may be omitted in FIGS. 6A, 6B, and 7. Hereinafter, the comparative and example display devices will be described with reference to FIGS. 6A, 6B, and 7.

Referring to FIGS. 6A, 6B, and 7, the comparative display device may be configured to include components corresponding to those of the example display device, except that the second adhesion member AM-C2 is omitted from the comparative display device. For example, the comparative display device may include the additional member ADM, the first circuit substrate MCB, the second circuit substrate FCB, the driving device DE, the first adhesion member AM-C1, and the conductive member AM-MB.

FIG. 6A illustrates a sectional view of the comparative display device in a normal state, and FIG. 6B illustrates a sectional view of the comparative display device of FIG. 6A on which an external impact is exerted. As shown in FIG. 6A, in the comparative embodiment, the first circuit substrate MCB may be fixed to the additional member ADM by the first adhesion member AM-C1, and the second circuit substrate FCB may be fixed to the first circuit substrate MCB by the conductive member AM-MB. Here, a delamination space "ds" may be defined between the second circuit substrate FCB and the additional member ADM.

As shown in FIG. 6B, if an external impact FS is exerted on the comparative display device, the second circuit substrate FCB and the driving device DE may be moved by the external impact. In the case where the driving device DE is moved by the external impact, a force may be exerted on the second circuit substrate FCB in a direction of the motion of the driving device DE, because the driving device DE has a relatively large mass.

Since the second circuit substrate FCB is fixed to the first circuit substrate MCB, there may be a limitation in motion of the second circuit substrate FCB resulting from the motion of the driving device DE. Accordingly, a portion of the second circuit substrate FCB (e.g., the region AA' shown in FIG. 6B) may be damaged by the external impact FS or the resulting stress.

As shown in FIG. 7, the example display device may further include the second adhesion member AM-C2, compared with the comparative display device. The second adhesion member AM-C2 may be configured to fix the second circuit substrate FCB to the additional member ADM. That is, the second adhesion member AM-C2 may exert a resistance force RS on the second circuit substrate FCB in a direction opposite to that of the external impact FS, and thus, the second circuit substrate FCB and the driving device DE may be prevented from being moved by the external impact FS. Since the second circuit substrate FCB is stably fixed by the second adhesion member AM-C2, it may be possible to prevent the second circuit substrate FCB from being abnormally moved by an external impact.

Figure 8A:
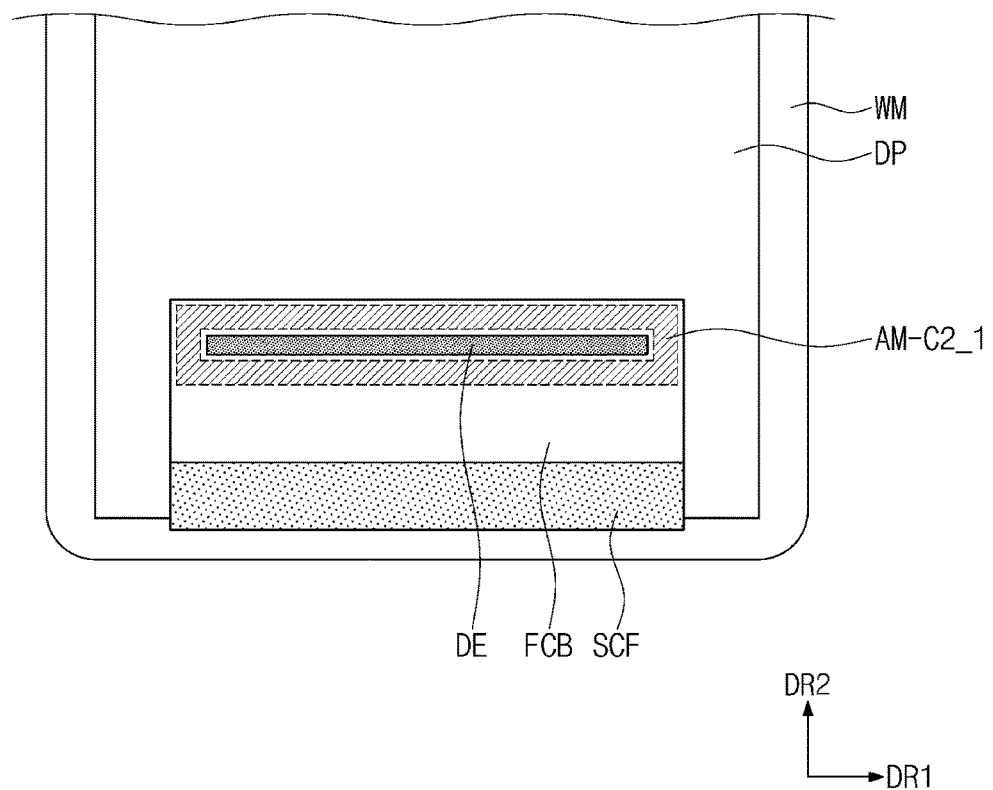
FIGS. 8A to 8C are plan views illustrating some members of a display device according to some embodiments of the inventive concept.
Figure 8B:
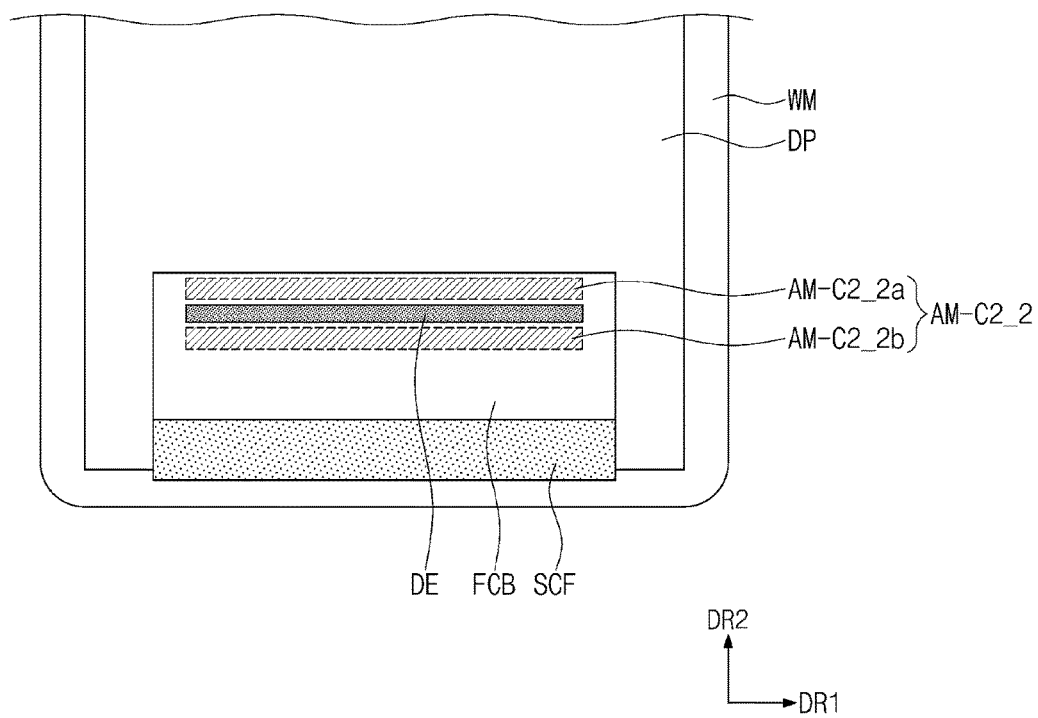
Figure 8C:
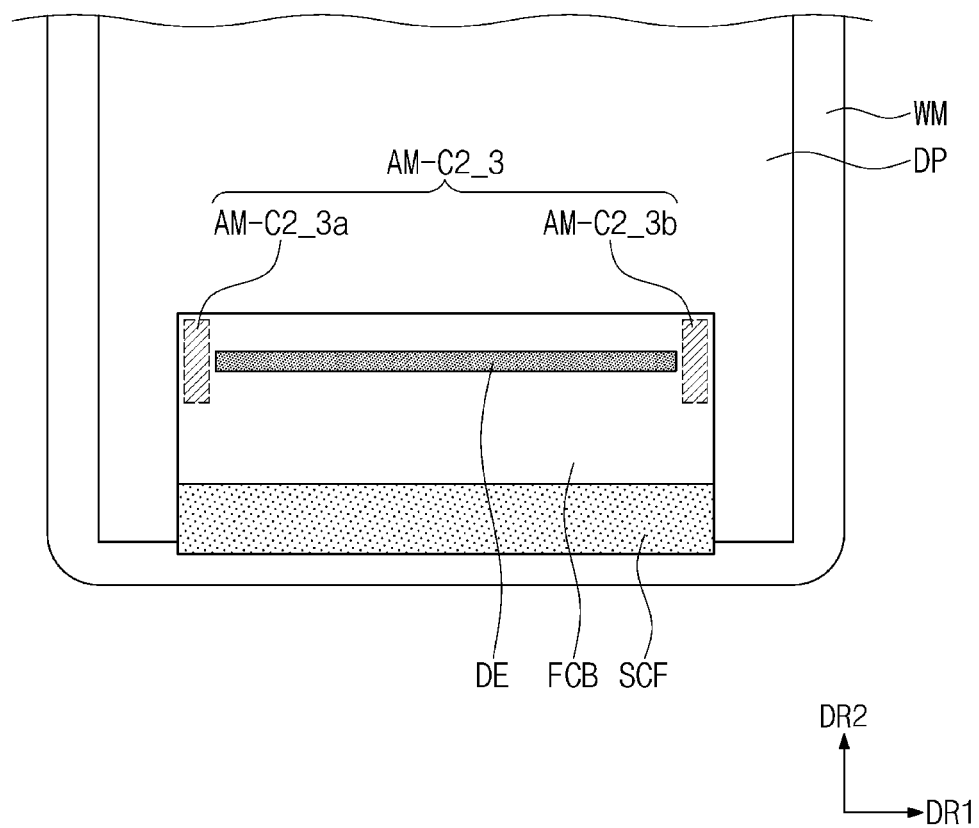

FIGS. 8A to 8C are plan views illustrating some elements of a display device according to some embodiments of the inventive concept. In FIGS. 8A to 8C, the first circuit substrate MCB (e.g., see FIG. 3A) is be omitted, and the second adhesion members AM-C2_1, AM-C2_2, and AM-C2_3 are depicted by the dotted lines. Hereinafter, a display device according to some embodiments of the inventive concept will be described with reference to FIGS. 8A to 8C. For concise description, an element previously described with reference to FIGS. 1A to 7 may be identified by a similar or identical reference number without repeating the description thereof.

In the present embodiment, the additional member ADM, the support panel PF, and the protection panel PL may be omitted, as shown in FIGS. 8A to 8C. Accordingly, the second adhesion members AM-C2_1, AM-C2_2, and AM-C2_3 may be directly attached to the display panel DP. In the present embodiment, each of the second adhesion members AM-C2_1, AM-C2_2, and AM-C2_3 may be configured to combine the second circuit substrate FCB with the display panel DP. However, the inventive concept is not limited to the above examples, and the second adhesion members AM-C2_1, AM-C2_2, and AM-C2_3 may be used to combine various members with the second circuit substrate FCB.

As shown in FIGS. 8A to 8C, the second adhesion member AM-C2_1 may be disposed to be non-overlapped with the driving device DE. For example, as shown in FIG. 8A, the second adhesion member AM-C2_1 may be disposed to have a closed-loop shape and enclose the driving device DE, when viewed in a plan view.

As shown in FIG. 8B, the second adhesion member AM-C2_2 may include sub-adhesion members AM-C2_2a and AM-C2_2b, which are spaced apart from each other, in the second direction DR2, with the driving device DE interposed therebetween, when viewed in a plan view. Alternatively, as shown in FIG. 8C, the second adhesion member AM-C2_3 may include sub-adhesion members AM-C2_3a and AM-C2_3b, which are spaced apart from each other, in the first direction DR1, with the driving device DE interposed therebetween. In particular, the sub-adhesion members may be disposed at the long ends of the driving device DE.

Since, as shown in FIGS. 8A to 8C, the second adhesion members AM-C2_1, AM-C2_2, and AM-C2_3 are not overlapped with the driving device DE, it may be possible to prevent adhesion characteristics of the second adhesion members AM-C2_1, AM-C2_2, and AM-C2_3 from being deteriorated by heat generated in the driving device DE. Accordingly, the second adhesion members AM-C2_1, AM-C2_2, and AM-C2_3 of the display device may fix the second circuit substrate FCB stably without deterioration in their adhesion characteristics even during use, and thus, it may be possible to prevent the second circuit substrate FCB from being abnormally moved.

Figure 9A:
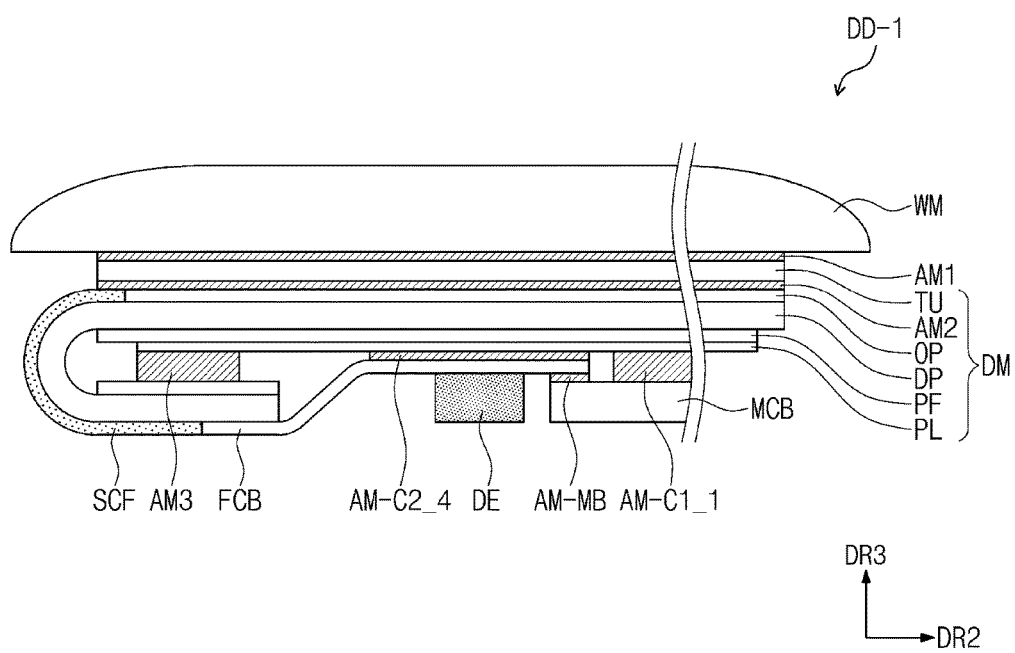
FIGS. 9A to 9C are sectional views illustrating display devices according to some embodiments of the inventive concept.
Figure 9B:
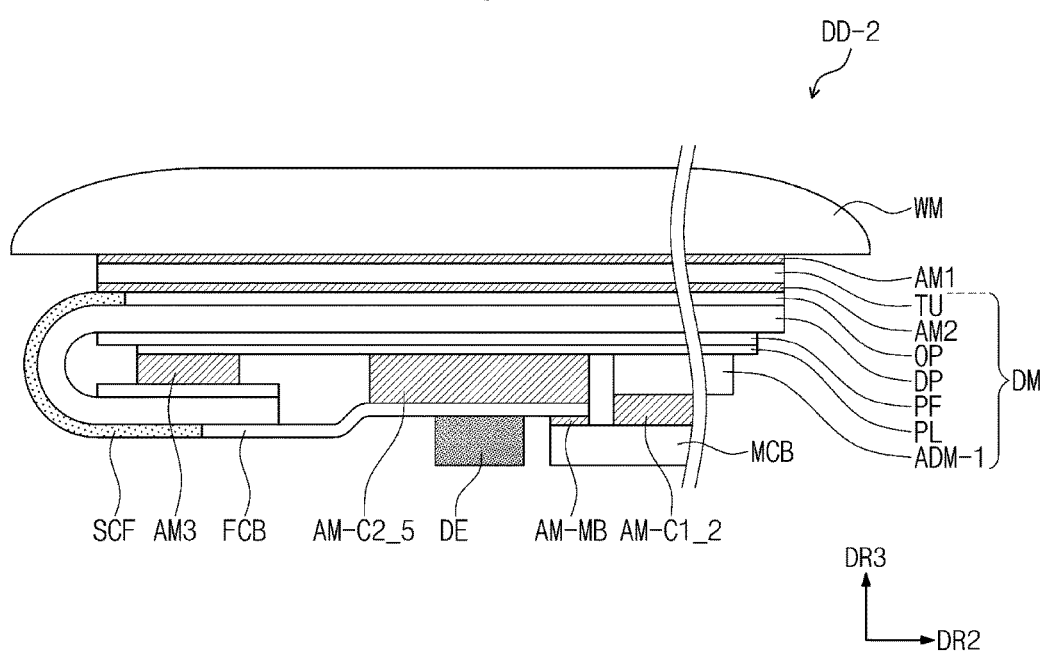
Figure 9C:
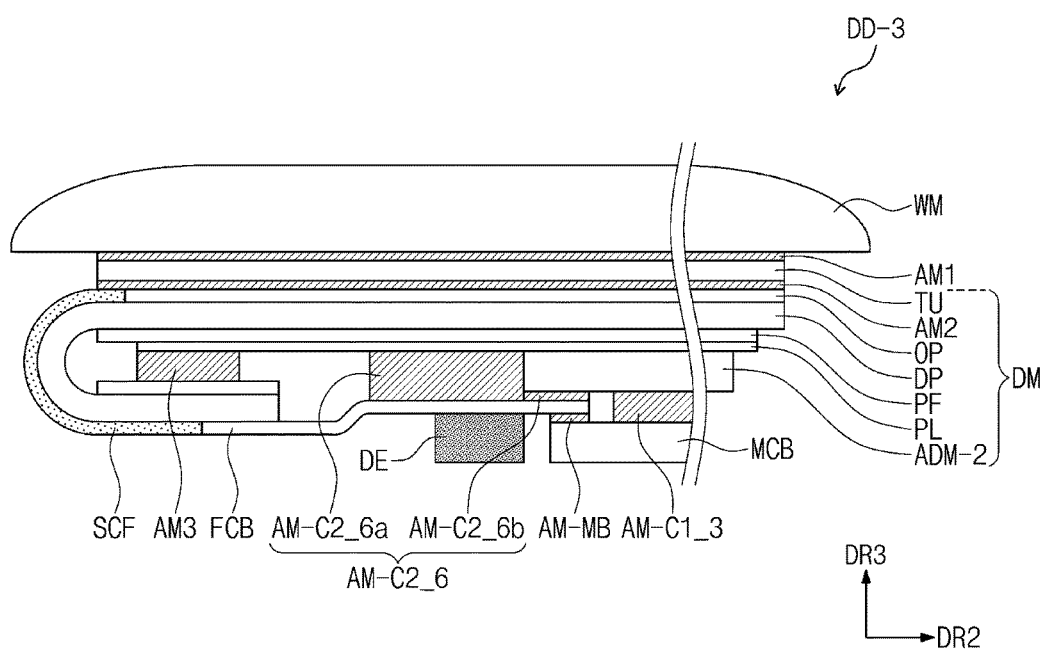

FIGS. 9A to 9C are sectional views illustrating display devices according to some embodiments of the inventive concept. Hereinafter, display devices DD-1, DD-2, and DD-3 according to some embodiments of the inventive concept will be described with reference to FIGS. 9A to 9C. For concise description, an element previously described with reference to FIGS. 1A to 8C may be identified by a similar or identical reference number without repeating the description thereof.

In the display device DD-1, the additional member ADM may be omitted, as shown in FIG. 9A. Accordingly, when the display panel DP is bent, the protection panel PL may be positioned below the driving control module DCM (e.g., see FIG. 3A).

A first adhesion member AM-C1_1 may be disposed to combine the first circuit substrate MCB with the protection panel PL. The first adhesion member AM-C1_1 may be combined to the rear surface of the first circuit substrate MCB and the rear surface of the protection panel PL.

A second adhesion member AM-C2_4 may be disposed to combine the second circuit substrate FCB with the protection panel PL. The second adhesion member AM-C2_4 may be combined to the rear surface of the second circuit substrate FCB and the rear surface of the protection panel PL. In the present embodiment, the first adhesion member AM-C1_1 and the second adhesion member AM-C2_4 may be disposed to combine the first circuit substrate MCB and the second circuit substrate FCB to the same surface (i.e., the rear surface of the protection panel PL).

As shown in FIG. 9B, the display device DD-2 may further include an additional member ADM-1, which is disposed to be overlapped with the first circuit substrate MCB. The additional member ADM-1 may be disposed on the rear surface of the protection panel PL and overlap with the second circuit substrate FCB.

The first adhesion member AM-C1_2 may be disposed between the first circuit substrate MCB and the additional member ADM-1 to combine the first circuit substrate MCB with the rear surface of the additional member ADM-1. The second adhesion member AM-C2_5 may be disposed between the second circuit substrate FCB and the protection panel PL to combine the second circuit substrate FCB with the rear surface of the protection panel PL. Accordingly, the first adhesion member AM-C1_2 and the second adhesion member AM-C2_5 may be attached to different surfaces. In the display device DD-2, the first circuit substrate MCB and the second circuit substrate FCB may be disposed on different members but may be stably fixed, and thus, it may be possible to prevent the first circuit substrate MCB and the second circuit substrate FCB from being abnormally moved.

As shown in FIG. 9C, the display device DD-3 may include an additional member ADM-2, which is disposed to be overlapped with a portion of the second circuit substrate FCB. The first adhesion member AM-C$_{1\_3}$ may be disposed between the first circuit substrate MCB and the additional member ADM-2 to combine the first circuit substrate MCB with the rear surface of the additional member ADM-2.

A second adhesion member AM-C2_6 may include a first portion AM-C2_6a and a second portion AM-C2_6b. The first portion AM-C2_6a may be disposed between the second circuit substrate FCB and the protection panel PL to combine the second circuit substrate FCB with the rear surface of the protection panel PL. The second portion AM-C2_6b may be disposed between the second circuit substrate FCB and the additional member ADM-2 to combine the second circuit substrate FCB with the rear surface of the additional member ADM-2.

The first portion AM-C2_6a and the second portion AM-C2_6b may be disposed to be in contact with, or spaced apart from, each other. In certain embodiments, the first portion AM-C2_6a and the second portion AM-C2_6b may be connected to each other, thereby forming a single body.

In the display device DD-3, the rear surface of the second circuit substrate FCB may be coupled with a plurality of different members. Even if the second circuit substrate FCB is disposed to be overlapped with several members having different heights, the second adhesion member AM-C2_6 may be configured to fix each of such members with the second circuit substrate FCB, and thus, it may be possible to prevent the second circuit substrate FCB from being abnormally moved and improve reliability of a display device. Accordingly, it may be unnecessary to fix the first circuit substrate MCB or the second circuit substrate FCB to a specific member, when the first circuit substrate MCB or the second circuit substrate FCB is assembled. As a result, it may be possible to improve a degree of freedom in designing process.

According to some embodiments of the inventive concept, an electronic device may be configured to prevent electronic components therein from being abnormally moved, when an external impact is exerted thereon, thereby having improved reliability. In addition, the electronic components may be stably fastened to various components, not to a specific component, and thus, the electronic device may be designed with a high degree of freedom.

While example embodiments of the inventive concept have been particularly shown and described, it will be understood by one of ordinary skill in the art that variations in form and detail may be made therein without departing from the spirit and scope of the attached claims.

What is claimed is:

1. An electronic device, comprising:
   a window member; and
   a display module disposed on a rear surface of the window member,
   wherein the display module comprises:
   a display panel comprising a non-bending region and a bending region bent from the non-bending region, the bending region comprising a curvature region with a specific curvature and an opposite region facing the non-bending region in a thickness direction of the display module;
   a first circuit substrate disposed on a rear surface of the display panel;
   a second circuit substrate electrically connecting the display panel with the first circuit substrate;
   a first adhesion member disposed on a rear surface of the first circuit substrate to combine the first circuit substrate with a first member different from the first circuit substrate; and
   a second adhesion member disposed on a rear surface of the second circuit substrate to combine the second circuit substrate with a second member different from the first circuit substrate.

2. The electronic device of claim 1, wherein the first member and the second member are the same.

3. The electronic device of claim 2, wherein the first member is the display panel, and the first adhesion member and the second adhesion member are combined at the rear surface of the display panel.

4. The electronic device of claim 2, wherein the display module further comprises an additional member disposed between the display panel and the first circuit substrate, and
   each of the first member and the second member is the additional member.

5. The electronic device of claim 4, wherein the additional member comprises a force sensing unit configured to sense an external pressure.

6. The electronic device of claim 1, wherein the first member is different from the second member.

7. The electronic device of claim 6, further comprising an additional member disposed between the display panel and the first circuit substrate,
   wherein the second member is the display panel, and
   the first member is the additional member.

8. The electronic device of claim 1, further comprising a driving chip mounted on the second circuit substrate and electrically connected to the display panel.

9. The electronic device of claim 8, wherein the second adhesion member overlaps the driving chip when viewed in a plan view.

10. The electronic device of claim 8, wherein the second adhesion member is disposed to enclose the driving chip, when viewed in a plan view.

11. The electronic device of claim 8, wherein the second adhesion member comprises a plurality of portions spaced apart from each other.

12. The electronic device of claim 11, wherein the portions are disposed adjacent to the driving chip.

13. The electronic device of claim 8, wherein the first circuit substrate further comprises a cut portion disposed at a region overlapped with the second circuit substrate, and
   the cut portion is disposed to enclose at least three sides of the driving chip, when viewed in a plan view.

14. The electronic device of claim 1, further comprising a conductive member, which is disposed on a front surface of the first circuit substrate and the rear surface of the second circuit substrate to electrically connect the first circuit substrate to the second circuit substrate.

15. The electronic device of claim 14, wherein the conductive member overlaps the second adhesion member when viewed in a plan view.

16. The electronic device of claim 14, wherein the conductive member is an anisotropic conductive film.

17. The electronic device of claim 1, wherein the display module further comprises:
   a touch sensing unit disposed between the display panel and the window member, the touch sensing unit comprising a touch sensor configured to sense an external touch event; and
   a support panel disposed on the rear surface of the display panel.

18. The electronic device of claim 1, wherein the display panel further comprises a stress control film disposed on a front surface of the display panel and on the curvature region.

19. The electronic device of claim 1, wherein the second adhesion member combines the second circuit substrate with two members, the two members are the second member and a third member different from the second member.

20. An electronic device, comprising:
a window member;
a display panel disposed on a rear surface of the window member, the display panel comprising a non-bending region and a bending region bent from the non-bending region;
a first circuit substrate disposed on a rear surface of the display panel;
a second circuit substrate overlapped with the bending region to electrically connect the first circuit substrate to the display panel, a driving chip being mounted on a front surface of the second circuit substrate and extending in a direction;
a conductive member combined to a rear surface of the first circuit substrate and a front surface of the second circuit substrate to electrically connect the first circuit substrate to the second circuit substrate; and
a second circuit substrate adhesion member disposed on a rear surface of the second circuit substrate to combine the second circuit substrate with a second member,
wherein at least a portion of the first circuit substrate is overlapped with the driving chip when viewed in the direction.

21. The electronic device of claim 20, wherein the second circuit substrate adhesion member overlaps at least a portion of the driving chip.

22. The electronic device of claim 20, wherein the second circuit substrate adhesion member doesn't overlap the driving chip when viewed in a plan view.

23. The electronic device of claim 20, further comprising a first circuit substrate adhesion member that is disposed on the rear surface of the first circuit substrate to combine the first circuit substrate with a first member different from the first circuit substrate,
wherein the second circuit substrate adhesion member combines the second circuit substrate with the second member different from the first circuit substrate.

24. The electronic device of claim 23, further comprising an additional member provided between the display panel and the first circuit substrate,
wherein one of the first member and the second member is the additional member.

25. The electronic device of claim 24, wherein the other one of the first member and the second member is the display panel.

* * * * *